US012733478B2

(12) United States Patent
Chandrasekhar et al.

(10) Patent No.: US 12,733,478 B2
(45) Date of Patent: Sep. 8, 2026

(54) SELECTIVE BOTTOMLESS GRAPHENE LINED INTERCONNECTS

(71) Applicant: Intel Corporation, Santa Clara, CA (US)

(72) Inventors: Nita Chandrasekhar, Portland, OR (US); Vishal Tiwari, Hillsboro, OR (US); AKM Shaestagir Chowdhury, Portland, OR (US)

(73) Assignee: Intel Corporation, Santa Clara, CA (US)

(*) Notice: Subject to any disclaimer, the term of this patent is extended or adjusted under 35 U.S.C. 154(b) by 256 days.

(21) Appl. No.: 17/852,028

(22) Filed: Jun. 28, 2022

(65) Prior Publication Data

US 2023/0420361 A1 Dec. 28, 2023

(51) Int. Cl.
*H10W 20/42* (2026.01)
*H10W 20/00* (2026.01)

(52) U.S. Cl.
CPC ......... *H10W 20/42* (2026.01); *H10W 20/057* (2026.01); *H10W 20/076* (2026.01); *H10W 20/082* (2026.01); *H10W 20/093* (2026.01)

(58) Field of Classification Search
CPC ........... H01L 23/5226; H01L 21/76804; H01L 21/76822; H01L 21/76831; H01L 21/76879; H01L 2221/1063; H01L 21/76814; H01L 21/76826; H01L 21/7684; H10W 20/034; H10W 20/42; H10W 20/057; H10W 20/076; H10W 20/082; H10W 20/093; H10W 20/0765; H10W 20/081; H10W 20/096
See application file for complete search history.

(56) References Cited

U.S. PATENT DOCUMENTS

2018/0166333 A1* 6/2018 Yang ................ H01L 23/53233

* cited by examiner

*Primary Examiner* — Thanhha S Pham
(74) *Attorney, Agent, or Firm* — Schwabe, Williamson & Wyatt, P.C.

(57) ABSTRACT

Embodiments disclosed herein include integrated circuit structures and methods of forming such structures. In an embodiment, an integrated circuit structure comprises a dielectric layer with a first surface and a second surface, and an opening through the dielectric layer. In an embodiment, the opening is defined by sidewalls. In an embodiment, a graphene liner contacts the first surface of the dielectric layer and the sidewalls of the opening. In an embodiment, a conductive material at least partially fills a remainder of the opening.

22 Claims, 11 Drawing Sheets

300
341
342
305
322
304

300
341
343
342
305
322
304

690
691
692
693
694
695

SELECTIVE BOTTOMLESS GRAPHENE LINED INTERCONNECTS

TECHNICAL FIELD

Embodiments of the disclosure are in the field of semiconductor structures and processing and, in particular, to interconnects that are selectively lined with graphene to provide reduced interconnect resistance.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1:
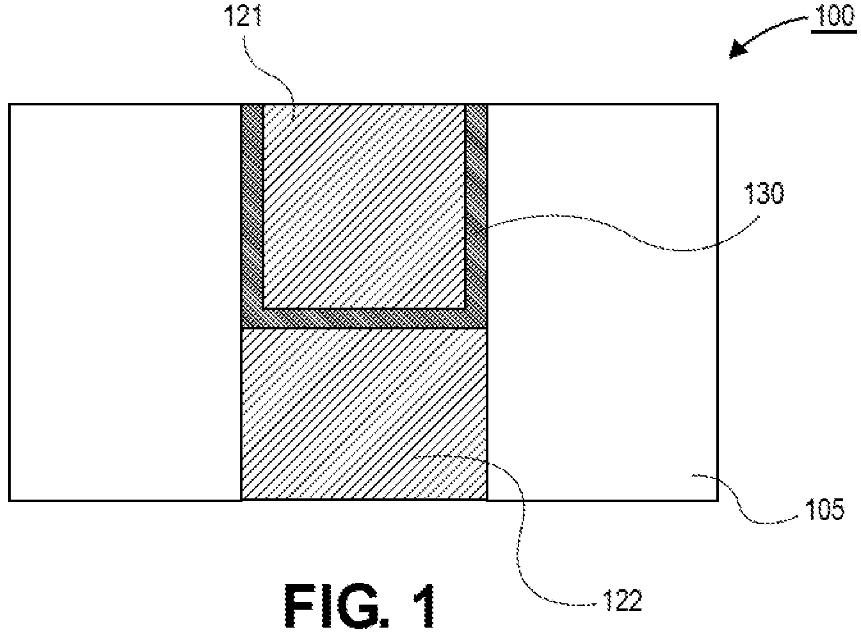
FIG. 1 is a cross-sectional illustration of an interconnect with a liner on three sides of the via, in accordance with an embodiment.

Embodiments described herein comprise interconnects that are selectively lined with graphene to provide reduced interconnect resistance. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating next generation interconnects through deposition of a graphene liner directly on a dielectric surface. Further, the graphene liner is prevented from being deposited on the bottom surface of the interconnect. As such, the resistance of the interconnect is reduced, since the electrical path does not need to pass through the graphene liner.

The disclosed embodiments provide a method for depositing the graphene liner in a hole of an inert dielectric material by applying a self-assembled monolayer (SAM) at the bottom of the opening. Then, the process continues by applying a non-hydrogen based plasma pretreatment, such as a halogen plasma, to effectively activate the surface of the dielectric at less than 400° C. The activated surface of the dielectric is then exposed to a carbon-based precursor to form the graphene liner, and then the SAM is removed. Thereafter, the hole is filled with a metal to form a conductive structure. As used herein, a hole in a layer may sometimes also be referred to as an opening. Embodiments may include or pertain to one or more of interconnects, transistors, memories, and system-on-chip (SoC) technologies. One or more embodiments may be implemented to realize improved electrical properties and lower electro-migration failures in SoCs of future technology nodes.

To provide context, FIG. 1 illustrates a portion of an integrated circuit (IC) 100 showing a cross-sectional view of a state-of-the-art interconnect 121. An interconnect is a structure used to electrically connect two or more circuit elements (such as transistors). In an embodiment, the interconnect 121 may be a via that connects a top trace (not shown) to a bottom trace 122. The interconnect 121 may include a liner 130 to prevent metal from leaching into the surrounding dielectric material 105. In the example shown in FIG. 1, the liner 130 may be a U-shaped liner. That is, the liner 130 may include vertical portions on the sides of the interconnect 121 and a horizontal portion at the bottom of the interconnect 121. However, providing the liner 130 over the bottom of the interconnect 121 impedes the flow of current through the IC 100. As such, the IC 100 has a high electrical resistance. In some applications, the liner 130 may comprise tantalum or tantalum nitride, and must be of sufficient thickness to prevent leaching. The thickness of the liner 130 may depend on the technique used to deposit the barrier material. For example, tantalum deposited using physical vapor deposition (PVD) may result in the liner 130 being 30-40 angstroms in thickness, while deposition using atomic layer deposition (ALD) may result in the liner 130 being approximately 15 angstroms in thickness. In some instances a graphene liner 130 can be used. A graphene liner 130 may be thinner than other types of liners 130. However, the bottom portion of the liner 130 still impedes the flow of current, even when graphene liners 130 are used.

Further, the use of graphene liners 130 is not without issue. A first challenge is that graphene deposition must currently be performed at higher temperatures (600-700° C.), which are unsuitable for deposition during back-end-of-line (BEOL) processing which can withstand a maximum of approximately 400° C. to prevent damage to exposed materials. A second challenge is determining a process to deposit graphene on an inert dielectric on which interconnects are formed, which requires a pretreatment to enable the deposition process.

In its native form, oxide-based dielectric surfaces are passivated by a layer of hydroxyl (—OH) groups that are not reactive, rendering the surface inert to further deposition processes. To substantially remove the passivation, a hydrogen ($H_2$)-based thermal pretreatment is commonly performed in which the surface is heated to high temperatures (~600-800° C.) or to an $H_2$ based plasma treatment.

However, the use of hydrogen plasma to activate the inert surface has several drawbacks. One drawback is that the use of hydrogen plasma has very strict process control requirements with controlled doses of plasma. In addition, the kinetic effectiveness of the hydrogen plasma activation process is limited due to the need for high activation energy requiring higher temperatures for the activation of the inert surface sufficient for graphene deposition.

As an example, assume that an $H_2$ plasma pretreatment is used on a dielectric comprising $SiO_2$. The ideal hydrogen plasma reaction is: Si—O—OH(s)+H (from plasma)→ $H_2O$+Si (dangling bonds on the surface, very reactive), which is the desired activation reaction.

However, a non-ideal hydrogen plasma reaction can result in an excess of $H_2$ plasma, which can re-passivate or make the surface inert again, negating the process goal. An excess H plasma reaction is: Si (dangling bonds)+H (from plasma)→ Si—H (passivated and inert Si—H surface). This is undesirable since a Si—H passivated surface is not reactive at low temperatures and is unsuitable for graphene deposition at a temperature less than 400° C. Consequently, use of $H_2$ plasma to activate the surface of the dielectric is not manufacturing worthy due to process sensitivity and control challenges.

According to the disclosed embodiments, a process for depositing graphene on a dielectric material is disclosed. More particularly, the disclosed embodiments are directed to improved activation of the passivated/inert dielectric surface using a halogen-based plasma activation process for subsequent graphene deposition. Halogen-based plasma activation resolves both the issues outlined above by making the dielectric surface more reactive, which in turn lowers the deposition temperature and enables deposition on less reactive surfaces. Accordingly, the processes of the disclosed embodiments enables deposition of graphene at relatively low temperatures of approximately 400° C., which is suitable for high-volume manufacturing of next generation interconnects.

Further, embodiments disclosed herein include a process for selectively depositing the graphene. That is, graphene is only deposited along sidewalls of the vias. As such, the bottom surface of the metal via can directly contact the underlying trace (or other conductive feature). Without the intervening graphene layer, the resistance through the via is reduced. Particularly, the selective deposition of the graphene liner is made with the use of SAMs that are deposited on the underlying conductive feature. The graphene does not deposit on the SAM. After graphene deposition, the SAM can be removed and the via may be plated.

Figure 2A:
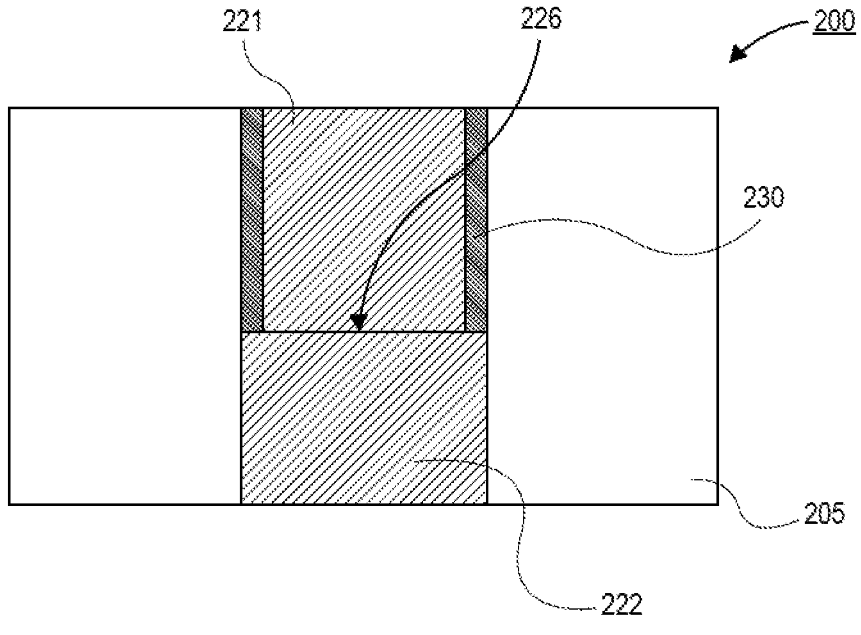
FIG. 2A is a cross-sectional illustration of an interconnect with a liner on sidewalls of the via, in accordance with an embodiment.

Referring now to FIG. 2A, a cross-sectional illustration of a portion of an IC 200 is shown, in accordance with an embodiment. In an embodiment, the IC 200 includes a dielectric layer 205. The dielectric layer 205 may sometimes be referred to as an interlayer dielectric (ILD). In an embodiment, as used throughout the present description, dielectric layers 205 and ILD material are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), PVD, or by other deposition methods.

In an embodiment, a trace 222 may be provided in the dielectric layer 205. In the illustration in FIG. 2A, the trace 222 may extend into and out of the plane of FIG. 2A. In an embodiment, as is also used throughout the present description, traces 222, metal lines or interconnect line material (and via material) is composed of one or more metal or other conductive structures. A common example is the use of copper lines and structures that may or may not include barrier layers between the copper and surrounding dielectric layer 205. As used herein, the term metal includes alloys, stacks, and other combinations of multiple metals. Thus, the traces 222 or vias 221 may be a single material layer, or may be formed from several layers, including conductive liner layers and fill layers. Any suitable deposition process, such as electroplating, CVD or PVD, may be used to form traces 222 and vias 221. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The traces 222 are also sometimes referred to in the art as interconnect lines, wires, lines, metal, or simply interconnect. In the illustrated embodiment, the trace 222 is shown without any liners. However, it is to be appreciated that trace 222 may include a liner in some embodiments. The liner on the trace 222 may be a graphene liner or a more traditional liner material such as Ta, TaN, Ti or TiN.

In an embodiment, the via 221 may be provided over a top surface of the trace 222. The via 221 may comprise a liner 230. Particularly, the liner 230 may be a graphene liner 230. The graphene liner 230 may have a thickness that is approximately 6 angstroms or less. As such, the thickness of the graphene liner 230 is thinner than existing liner architectures. As such, there is more volume in the opening through the dielectric layer 205 that can be filled with conductive via 221 material. In an embodiment, the graphene liner 230 may be provided only along the sidewalls of the via 221. That is, the via 221 may have a bottom surface 226 that is in direct contact with the metal material of the underlying trace 222. As such, the electrical resistivity through the via 221 is reduced compared to existing architectures, such as the architecture shown in FIG. 1.

In an embodiment, the via 221 and the underlying trace 222 may have critical dimensions (CDs) that are highly scaled. For example, a width of the via 221 may be approximately 20 nm or smaller. Aggressive scaling is possible due to several aspects of the architecture. For example, since the liners 230 are exceptionally thin (e.g., 6 angstroms or smaller), the volume of conductive material in the via 221 can be increased. Additionally, since the liner 230 does not separate the via 221 from the trace 222, the resistance is further reduced.

Figure 2B:
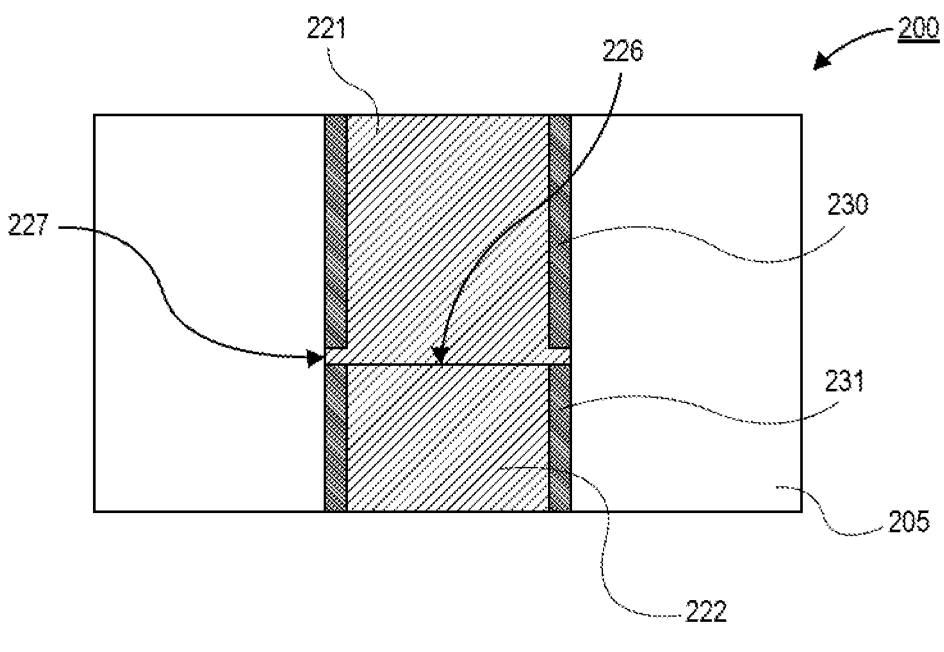
FIG. 2B is a cross-sectional illustration of an interconnect with a liner on sidewalls of the via and a gap between the liner on the via and the underlying trace, in accordance with an embodiment.

Referring now to FIG. 2B, a cross-sectional illustration of a portion of an IC 200 is shown, in accordance with an additional embodiment. As shown, the trace 222 may further comprise a liner 231. For example, the liner 231 may be a graphene liner. The material and thickness of the liner 231 may be similar to the material and thickness of the liner 230 on the sides of the via 221. Similar to the embodiment described above, the bottom surface 226 of the via 221 may be in direct contact with the underlying trace 222.

In a particular embodiment, there may be a gap 227 between the liner 230 and the liner 231. The gap 227 may be the result of processing operations that are used to form the liner 230. As will be described in greater detail below, a SAM may be provided over the top surface of the trace 222. A thickness of the SAM may protect a portion of the sidewall from receiving the graphene liner 230. For example, the thickness of the SAM may be approximately 1 nm or less. Accordingly, a small portion of the via 221 may have a wider width than the majority of the via 221.

Figure 2C:
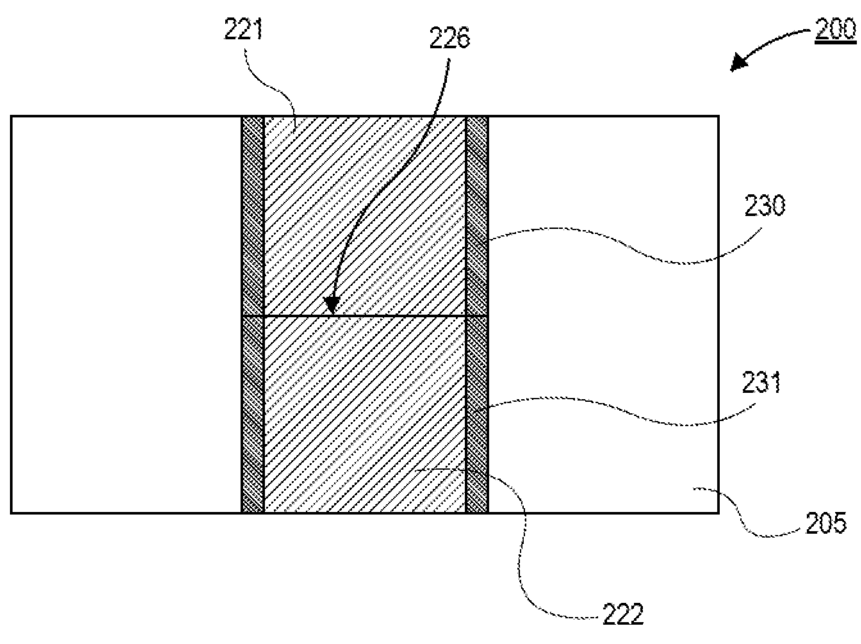
FIG. 2C is a cross-sectional illustration of an interconnect with a liner on sidewalls of the via where the liner of the via contacts a liner of the underlying trace, in accordance with an embodiment.

Referring now to FIG. 2C, a cross-sectional illustration of a portion of an IC 200 is shown, in accordance with an additional embodiment. In an embodiment, the IC 200 may include a trace 222 and a via 221. The bottom surface 226 of the via 221 may be in direct contact with the trace 222. Additionally, the liner 230 on the sidewalls of the via 221 may directly contact the liner 231 of the trace 222. In a particular embodiment, the liner 230 is deposited with a different processing operation than the liner 231. Since they are deposited with different processes, a thickness of the liner 230 may be different than a thickness of the liner 231.

Referring now to FIGS. 3A-3G, a series of cross-sectional illustrations depicting a process for forming a portion of an IC 300 is shown, in accordance with an embodiment. In the illustrated embodiment, the graphene liner 330 is formed with low temperature deposition process that is compatible with front-end-of-line (FEOL) and back-end-of-line (BEOL) temperature limitations. Additionally, the liner 330 is selectively deposited along sidewalls of the dielectric layer 305 in order to reduce the resistivity of the via 321.

Figure 3A:
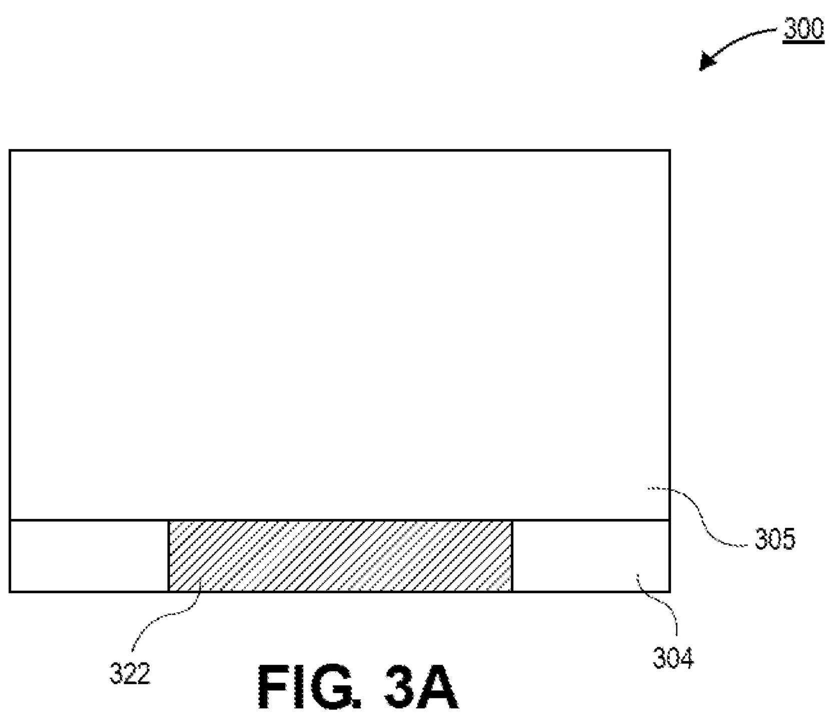
FIG. 3A is a cross-sectional illustration of an interconnect at a stage of manufacture, in accordance with an embodiment.

Referring now to FIG. 3A, a cross-sectional illustration of a portion of the IC 300 at a stage of manufacture is shown, in accordance with an embodiment. In an embodiment, the IC 300 may include a first dielectric layer 304. A trace 322 may be provided in the first dielectric layer 304. The trace 322 is shown without any liner. However, in other embodiments, a liner may be provided along sidewalls and a bottom surface of the trace 322, as will be described in greater detail below. In an embodiment, a second dielectric layer 305 is provided over the first dielectric layer 304. While shown as having a distinct interface with each other, it is to be appreciated that there may be no discernable interface between the first dielectric layer 304 and the second dielectric layer 305 in some embodiments.

Figure 3B:
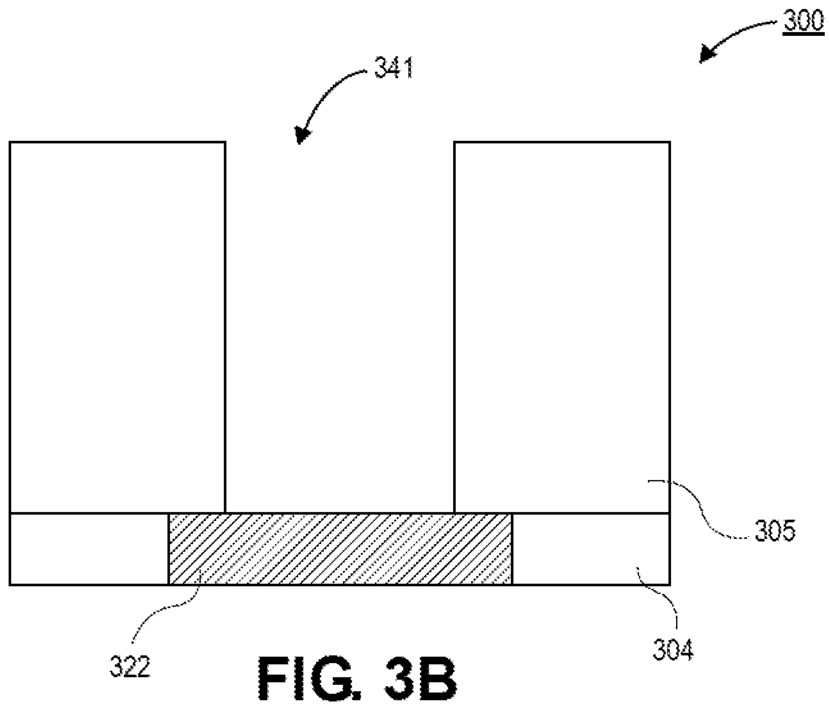
FIG. 3B is a cross-sectional illustration of the interconnect after a via opening is formed, in accordance with an embodiment.

Referring now to FIG. 3B, a cross-sectional illustration of the IC 300 after a via opening 341 is provided in the second dielectric layer 305 is shown, in accordance with an embodiment. In an embodiment, the via opening 341 may pass through an entire thickness of the second dielectric layer 305. In an embodiment, the via opening 341 may expose a portion of the underlying trace 322. The via opening 341 is shown with vertical sidewalls. However, in other embodiments, the sidewalls of the via opening 341 may be tapered. That is, a top of the via opening 341 may be wider than a bottom of the via opening 341. In an embodiment, a width of the via opening 341 may be aggressively scaled. For example, a width of the via opening 341 may be approximately 20 nm or less. A width of the via opening 341 may be smaller than a width of the trace 322 in some embodiments.

Figures 3C, 3D:
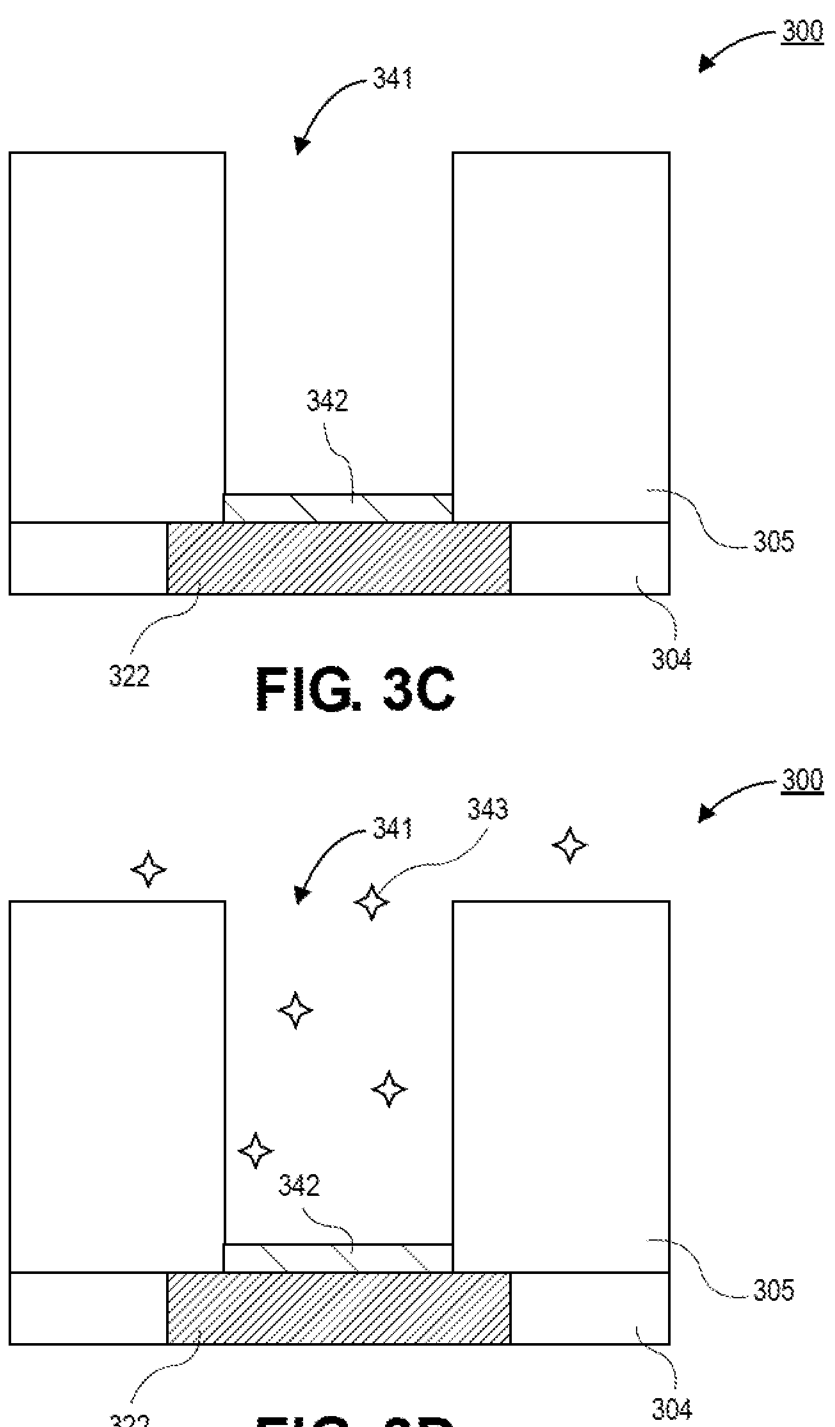
FIG. 3C is a cross-sectional illustration of the interconnect after a self-assembled monolayer (SAM) is provided at a bottom of the opening, in accordance with an embodiment.
FIG. 3D is a cross-sectional illustration of the interconnect after a plasma treatment process is performed, in accordance with an embodiment.

Referring now to FIG. 3C, a cross-sectional illustration of the IC 300 after a SAM 342 is applied over the underlying trace 322 at the bottom of the via opening 341 is shown, in accordance with an embodiment. In an embodiment, the SAM 342 may be selectively applied to the exposed metal surface of the trace 322. SAM materials that deposit easily on metal surfaces (such as copper) include, but are not limited to, n-alkanethiols, imidazoles, and octadecyl trichlorosilanes. In an embodiment, the SAM 342 protects the underlying trace 322 from deposition of the liner. The SAM 342 may also block a small portion of the sidewall of the via opening 341 from receiving the liner.

Referring now to FIG. 3D, a cross-sectional illustration of the IC 300 after a plasma pretreatment 343 is shown, in accordance with an embodiment. The plasma pretreatment 343 may include a non-hydrogen based plasma that is applied to the surface of the dielectric layer 305 to substantially remove any passivation and provide an activated dielectric surface. As shown the non-hydrogen based plasma pretreatment 343 is applied to a top surface of the dielectric layer 305, including the sides of the via opening 341.

According to one embodiment, the non-hydrogen plasma pretreatment acts as an activation process based on use of a halogen plasma to substantially remove any passivation (e.g., —OH) present on the dielectric surface prior to graphene deposition. This activation is required for deposition of graphene at lower temperatures. Activation of the surface of the dielectric layer 305 using halogen plasma results in a reactive surface with O dangling bonds that bind to the incoming carbon-based precursor promoting growth on oxide surfaces. The energy barrier of surface activation is 2.3× lower using the disclosed process as compared to the conventional hydrogen plasma activation process allowing the present process to occur at lower temperatures.

In one embodiment, the non-hydrogen based plasma pretreatment 343 comprises a halogen-based plasma. Example types of halogen-based plasma that may be used include fluorine (e.g., $F_2$), chlorine (e.g., $Cl_2$), bromine (e.g., $Br_2$), or hydrogen bromide (HBr), and plasmas containing halogen such as sulfur tetrafluoride (e.g., $SF_6$), nitrogen trifluoride ($NF_3$), fluoromethylene ($CH_xF_y$), or chloromethylene ($CH_xCl_y$). In other embodiments, the non-hydrogen based plasma pretreatment 343 may comprise a fluorocarbon plasma ($CF_x$), a chlorocarbon plasma ($CCl_x$), a carbon-halogen plasma, or a chlorofluoro plasma ($ClF_3$).

In the embodiment where the chlorine (Cl)-based plasma is used as the activation pretreatment, the Cl-based plasma reacts with hydrogen (H) on the surface of the dielectric layer 305 to form volatile byproducts such as hydrogen chloride (HCl), and oxygen (O) dangling bonds. Post Cl exposure, O dangling bonds remain on the surface of the dielectric layer 305. The dangling bonds are extremely reactive and bind very strongly to the incoming precursors. If excess of Cl plasma is used and the surface is now Cl terminated, the dangling bonds can continue to react with the incoming carbon-based precursors and form graphene under process conditions. This is not the case where H-based plasmas are used and over-exposure to the plasma negates the activation such that no film can be grown at lower temperatures.

Figure 3E:
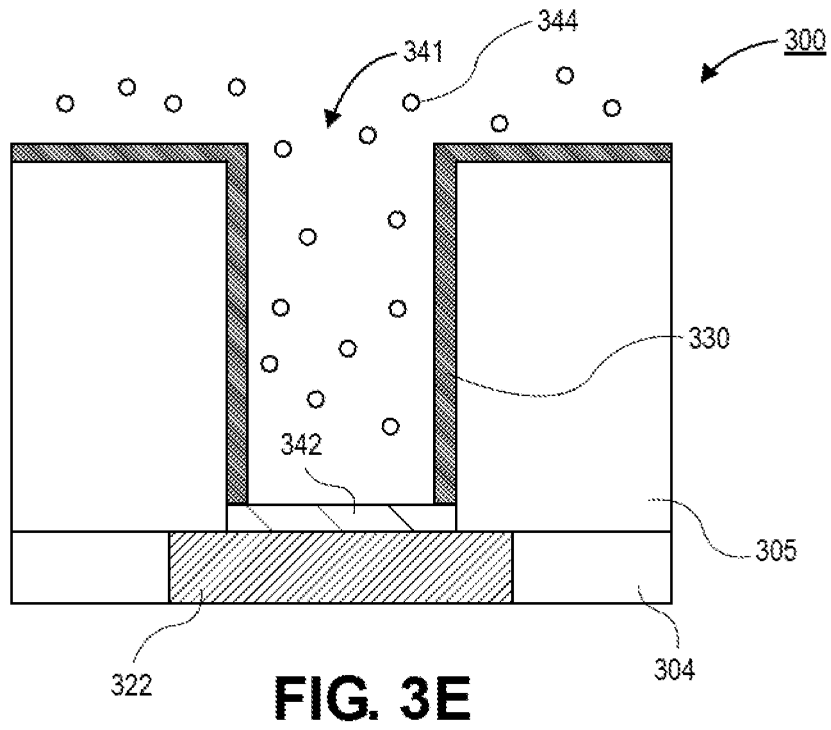
FIG. 3E is a cross-sectional illustration of the interconnect after a liner is deposited in the via opening, in accordance with an embodiment.

Referring now to FIG. 3E, a cross-sectional illustration of the IC 300 after deposition of a graphene liner 330 is shown, in accordance with an embodiment. The graphene liner 330 may be formed by exposing a carbon-based precursor 344 to the surface of the dielectric layer 305 at less than approximately 400° C. In an embodiment, the graphene liner 330 is conformal to the surface of the via opening 341 in the dielectric layer 305. The graphene liner 330 may also be deposited over a top surface of the dielectric layer 305. In one embodiment, the carbon-based precursor 344 may comprise any source of carbon atoms suitable for forming a graphene barrier including, but not limited to, alkane, alkene, alkynes, cyclic hydrocarbons, aromatic carbon compounds, hydrocarbons, and the like. Assuming the dielectric layer 305 is oxide-based, optimal activation of the dielectric surface by non-hydrogen based plasma results in a reactive surface with either Si or O dangling bonds that bind to the incoming carbon-based precursor promoting growth on the oxide-based dielectric surface. Furthermore, it is to be appreciated that the SAM 342 prevents the deposition of the graphene liner 330 on the surface of the trace 322. In an embodiment, the graphene liner 330 may be one or more monolayers thick. In a particular embodiment, the graphene liner 330 may be approximately 6 angstroms thick or less.

Figure 3F:
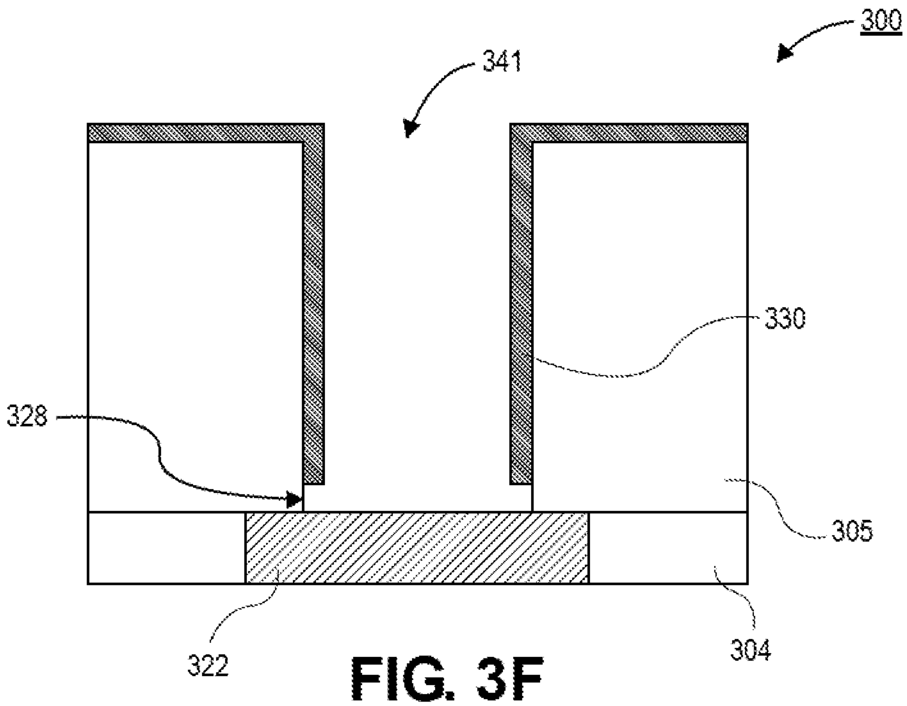
FIG. 3F is a cross-sectional illustration of the interconnect after the SAM is removed, in accordance with an embodiment.

Referring now to FIG. 3F, a cross-sectional illustration of the IC 300 after the SAM 342 is removed is shown, in accordance with an embodiment. In an embodiment, removal of the SAM 342 may result in the exposure of a portion 328 of the sidewall of the via opening 341. That is, the graphene liner 330 may not extend all the way down the sidewall of the via opening 341 to the top surface of the trace 322. In an embodiment, the SAM 342 may be removed with any suitable etching process or the like. Removal of the SAM 342 does not impact the graphene liner 330. That is, wet or dry etching processes that are selective to the SAM 342 over the graphene liner 330 are available.

Figure 3G:
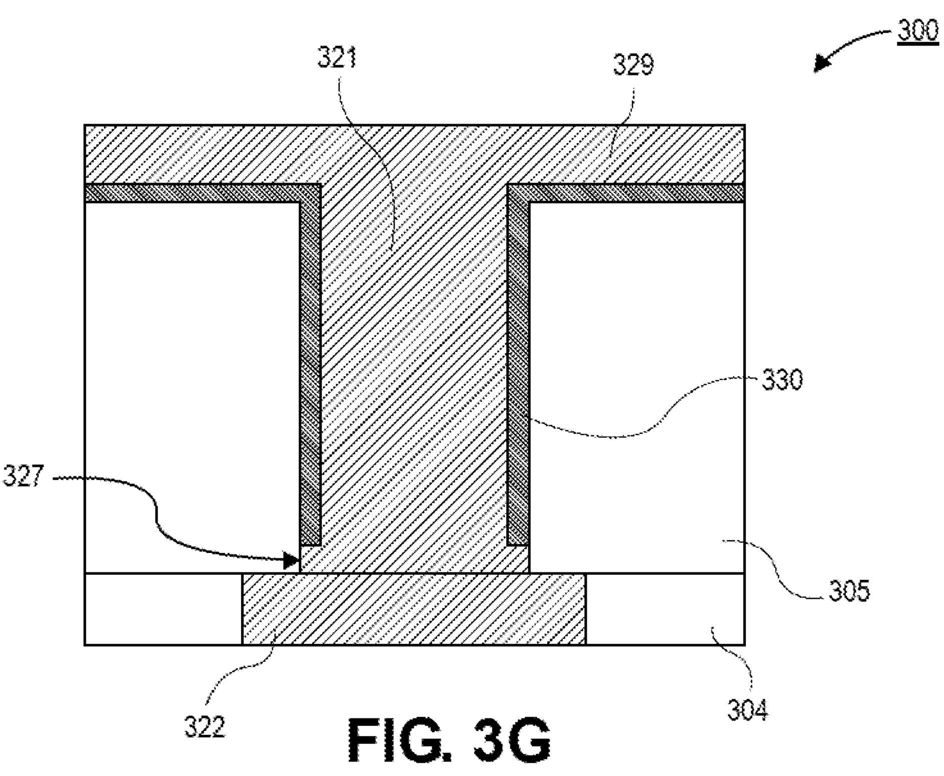
FIG. 3G is a cross-sectional illustration of the interconnect after a via is deposited in the via opening, in accordance with an embodiment.

Referring now to FIG. 3G, a cross-sectional illustration of the IC 300 after a metal layer is deposited into the via opening 341 and over the dielectric layer 305 is shown, in accordance with an embodiment. In an embodiment, the metal layer may form a via 321 through the dielectric layer 305. The via 321 may directly contact a surface of the underlying trace 322. That is, there is no liner between the bottom of the via 321 and the top of the trace 322. In an embodiment, sidewalls of the via 321 may be lined by the graphene liner 330. However, a bottom portion 327 of the via 321 may be in contact with the dielectric layer 305. Accordingly, the via 321 may have a top-hat shaped cross-section in some embodiments. A top-hat shaped cross-section may include a bottom region that is wider than an overlying region.

Figure 4A:
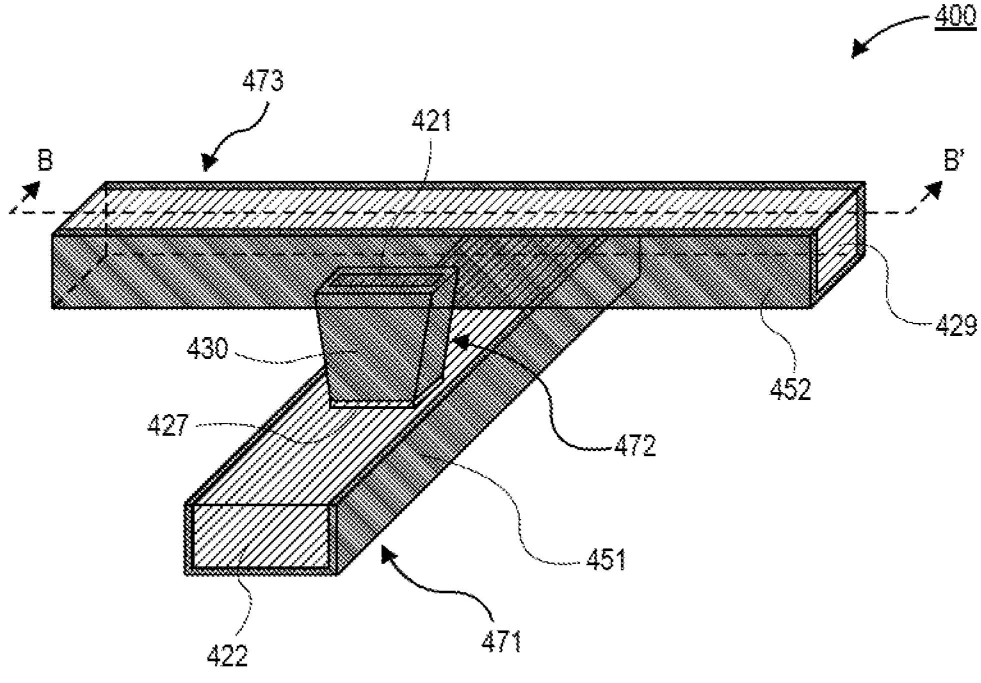
FIG. 4A is a perspective view illustration of an interconnect in an integrated circuit structure, in accordance with an embodiment.

Referring now to FIG. 4A, a perspective view illustration of a portion of an IC 400 is shown, in accordance with an embodiment. In the illustrated embodiment, a first trace 471, a second trace 473, and a via 472 are shown. The first trace 471 may be substantially orthogonal to the second trace 473. The via 472 may provide an electrical connection between the first trace 471 and the second trace 473. In an embodiment, the first trace 471, the via 472, and the second trace 473 may each comprise a liner, such as graphene liners. For example, graphene liner 451 is provided on the metal 422 of the first trace 471, a liner 430 is provided around the metal 421 of the via 472, and a liner 452 is provided on the metal 429 of the second trace 473.

In an embodiment, the liner 451 may have a U-shaped cross-section. As used herein, a U-shaped cross-section may refer to a shape that includes a pair of vertical portions that are connected at their bottom by a horizontal portion. It is to be appreciated that the vertical portions may not necessarily be perfectly vertical or orthogonal to the horizontal portion. Additionally, the horizontal portion may not necessarily be perfectly horizontal. In the particular instance of the first trace 471, the vertical portions of the liner 451 may be up the sidewalls of the metal 422, and the horizontal portion may be provided on the bottom surface of the metal 422.

In an embodiment, the liner 430 may be provided around a perimeter of the metal 421 of the via 472. The liner 430 may surround an entire perimeter of the metal 421. In some embodiments, a top of the liner 430 may contact the liner 452 of the second trace 473. The bottom of the liner 452 may be spaced away from the surface of the metal 422 of the first trace 471. That is, a portion 427 of the metal 421 of the via 472 may separate the bottom of the liner 452 from the metal 422.

In an embodiment, the second trace 473 may also comprise a U-shaped cross-section liner 452 around portions of the metal 429. The vertical portions of the liner 452 may be up the sidewalls of the metal 429, and the horizontal portion of the liner 452 may be provided below the metal 429. It is to be appreciated that the horizontal portion of the liner 452 may not be continuous over the entire bottom surface of the metal 429. Instead, an opening may be provided over the via 472. As such, the metal 429 of the second trace 473 may directly contact the metal 421 of the via 472.

Figure 4B:
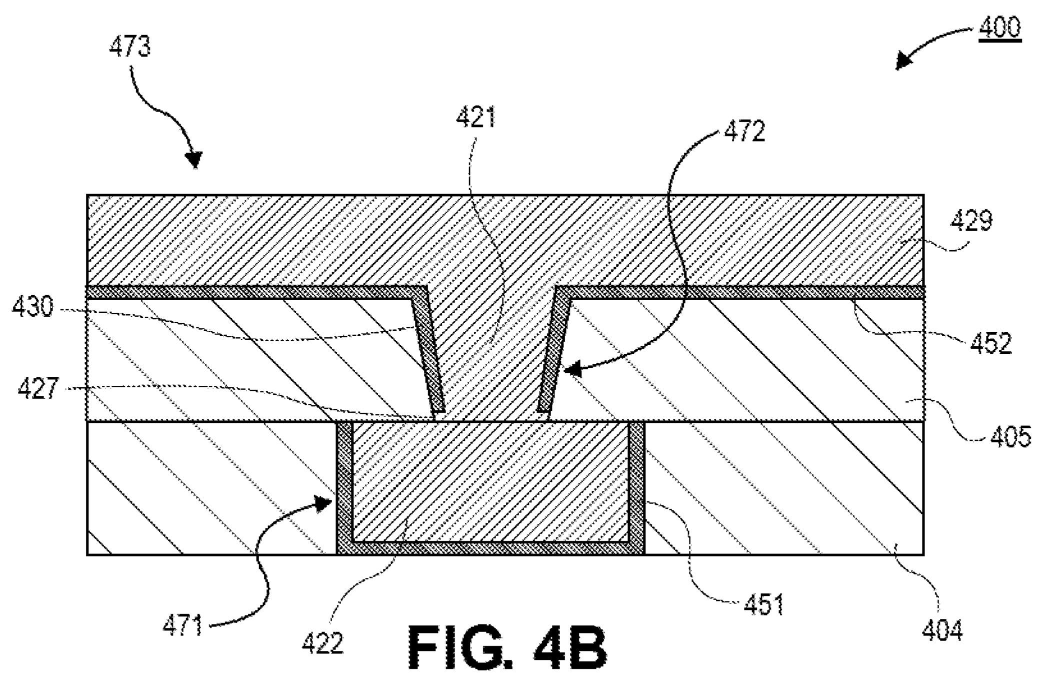
FIG. 4B is a cross-sectional illustration of the interconnect in FIG. 4A along line B-B', in accordance with an embodiment.

Referring now to FIG. 4B, a cross-sectional illustration of the portion of the IC 400 is shown, in accordance with an embodiment. The cross-sectional illustration in FIG. 4B is along the line B-B' in FIG. 4A. Additionally, FIG. 4B illustrates the dielectric layers 404 and 405 that surround the interconnects. In FIG. 4B, the U-shaped cross-section of the liner 451 of the first trace 471 is clearly shown. Additionally, the contact between the bottom of the metal 421 of the via 472 and the metal 422 of the first trace 471 is shown. The liner 430 around the metal 421 of the via 472 is also shown. A portion 427 of the metal 421 is provided between a bottom of the liner 430 and the top of the metal 422 of the first trace 471. Additionally, the connection between the liner 430 and the liner 452 is also visible in FIG. 4B. An opening through the liner 452 in order to make contact between the metal 429 of the second trace 473 and the metal 421 of the via 472 is also depicted. Accordingly, a path that passes only through metal 421 electrically connects the first trace 471 to the second trace 473. As such, resistance of the interconnect is significantly decreased compared to existing architectures.

Figure 5A:
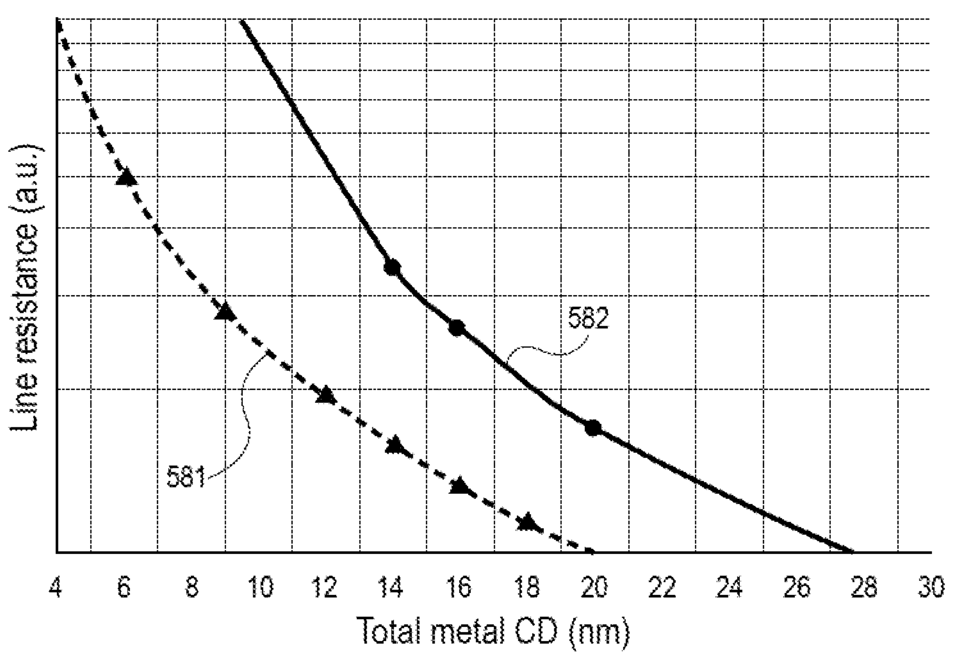
FIG. 5A is a graph of line resistances for different interconnect architectures, in accordance with an embodiment.
Figure 5B:
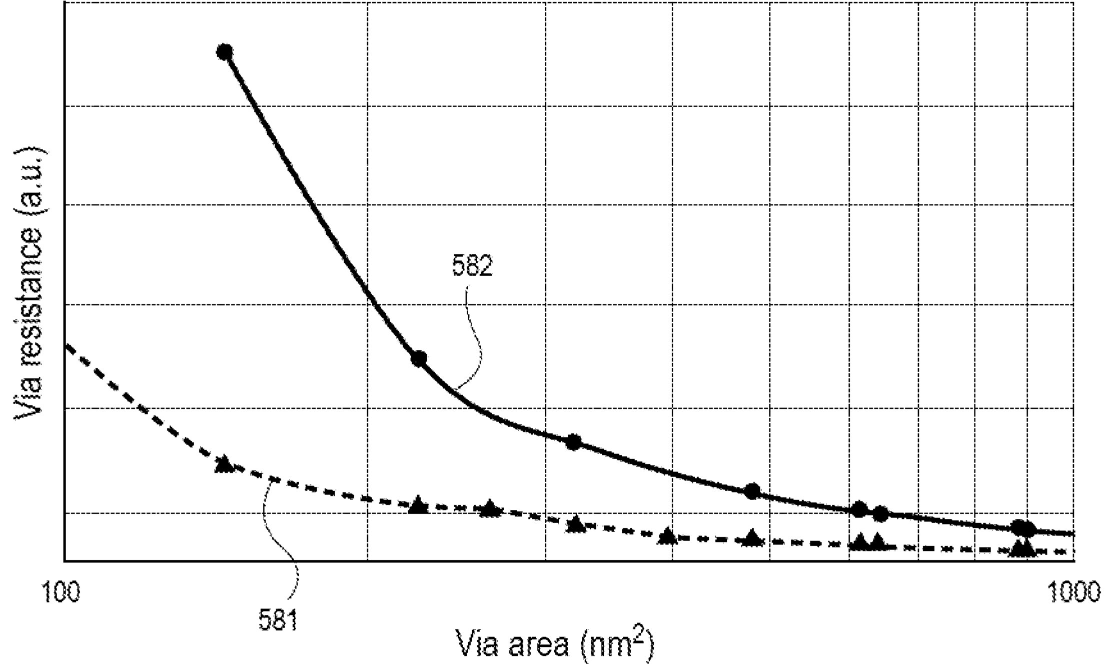
FIG. 5B is a graph of via resistances for different interconnect architectures, in accordance with an embodiment.

The resistance benefits of embodiments disclosed herein are clearly illustrated in FIGS. 5A and 5B. FIG. 5A depicts the line resistance improvement between existing architectures 582 and architectures 581 in accordance with embodiments described herein. As shown, at a critical dimension (CD) of 10 nm the line resistance of the architecture 581 may have an approximately 3× improvement compared to the existing architectures 582. FIG. 5B illustrates the via resistance improvements. As shown, as the via diameter scales smaller, the improvement of the architectures 581 in accordance with embodiments described herein increases compared to existing architectures 582. For example, at via areas of approximately 150 $nm^2$, the architecture 581 in accordance with embodiments described herein may have an approximately 5× improvement compared to the existing architectures 582.

Figure 6:
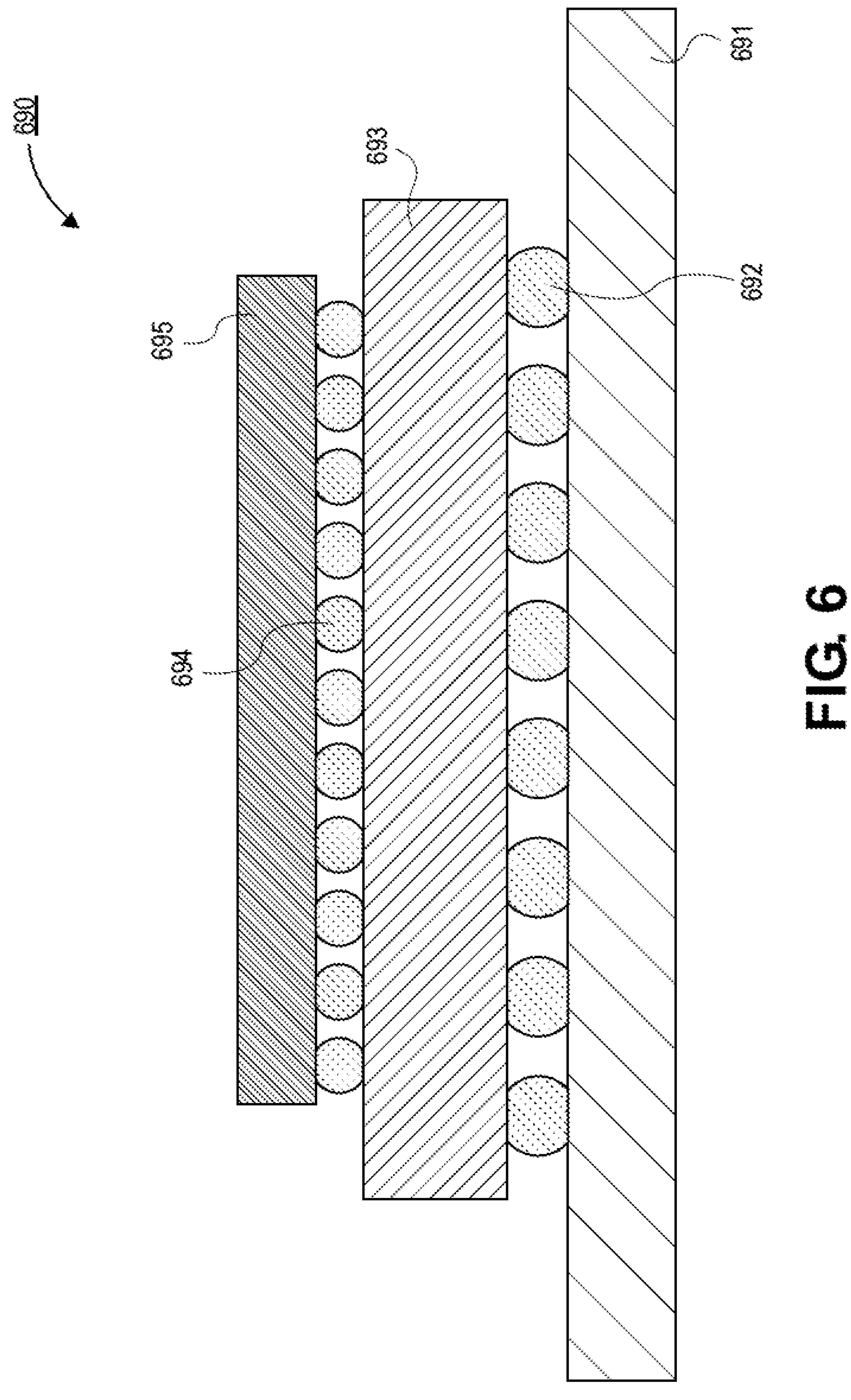
FIG. 6 is a cross-sectional illustration of an electronic system with a die that includes interconnect architectures with liners, in accordance with an embodiment.

Referring now to FIG. 6, a cross-sectional illustration of an electronic system 690 is shown, in accordance with an embodiment. In an embodiment, the electronic system 690 may comprise a board 691, such as a printed circuit board (PCB). In an embodiment, the board 691 may be coupled to a package substrate 693 by interconnects 692. For example, the interconnects 692 may include solder balls, pins, or the like. In an embodiment, the package substrate 693 may be coupled to a die 695 by first level interconnects (FLIs) 694, such as solder balls, copper bumps, or the like.

In an embodiment, the die 695 may be any type of die with active circuitry. For example, the die 695 may be a compute die, a communications die, a memory die, or any other type of die 695. In an embodiment, the die 695 may include integrated circuitry that includes interconnects in ILD layers. In a particular embodiment, the interconnects include metal traces and/or vias that include a graphene liner. The graphene liner may be approximately 6 angstroms thick or smaller. Additionally, there is no portion of the graphene liner that is between the via and the overlying or underlying traces. Accordingly, electrical resistance values are significantly reduced, even with aggressive scaling to CDs and pitches that are approximately 20 nm or smaller.

Figure 7:
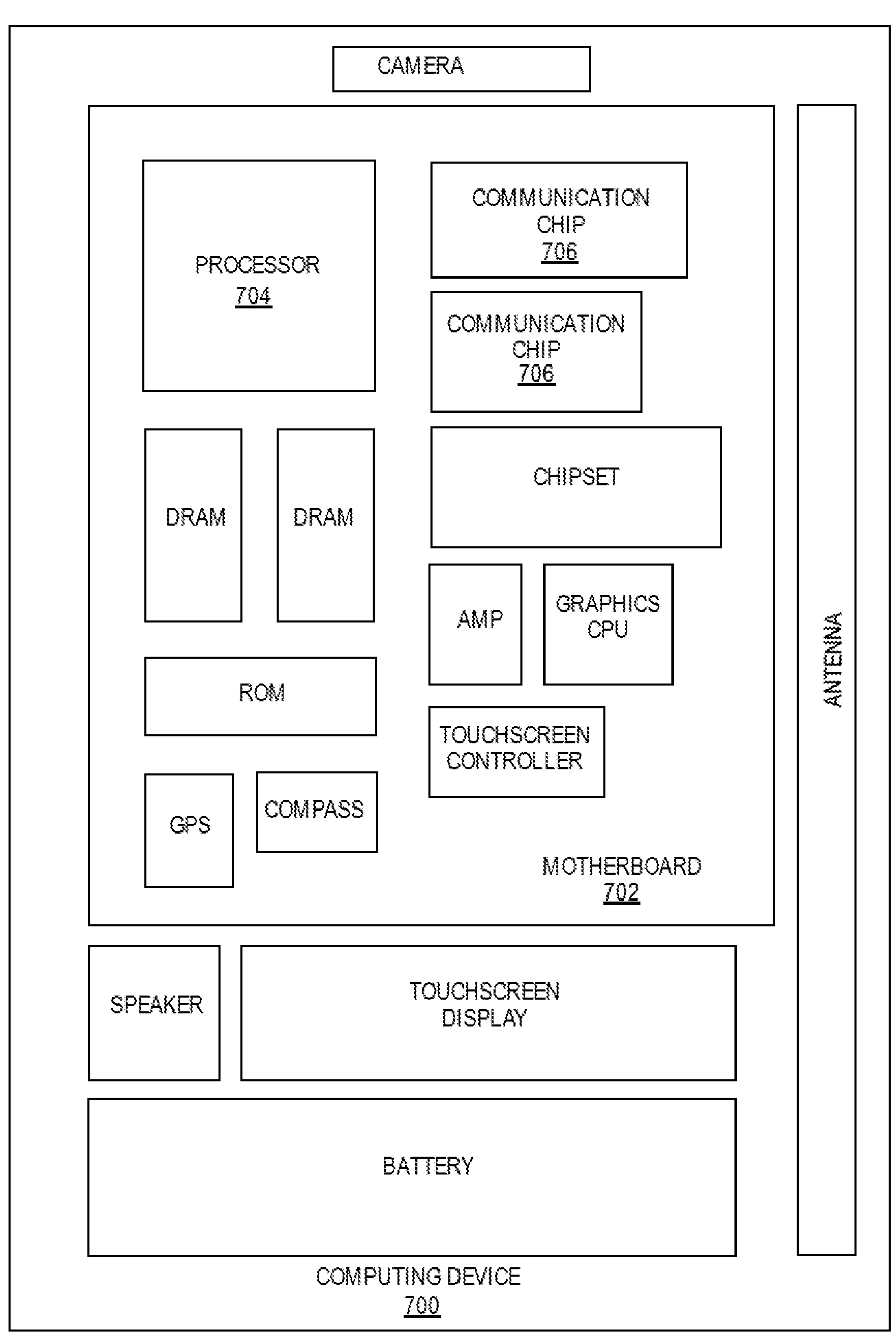
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise an interconnect with a graphene liner that is approximately 6 angstroms thick or less, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip may comprise an interconnect with a graphene liner that is approximately 6 angstroms thick or less, as described herein.

In further implementations, another component housed within the computing device 700 may comprise an interconnect with a graphene liner that is approximately 6 angstroms thick or less, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
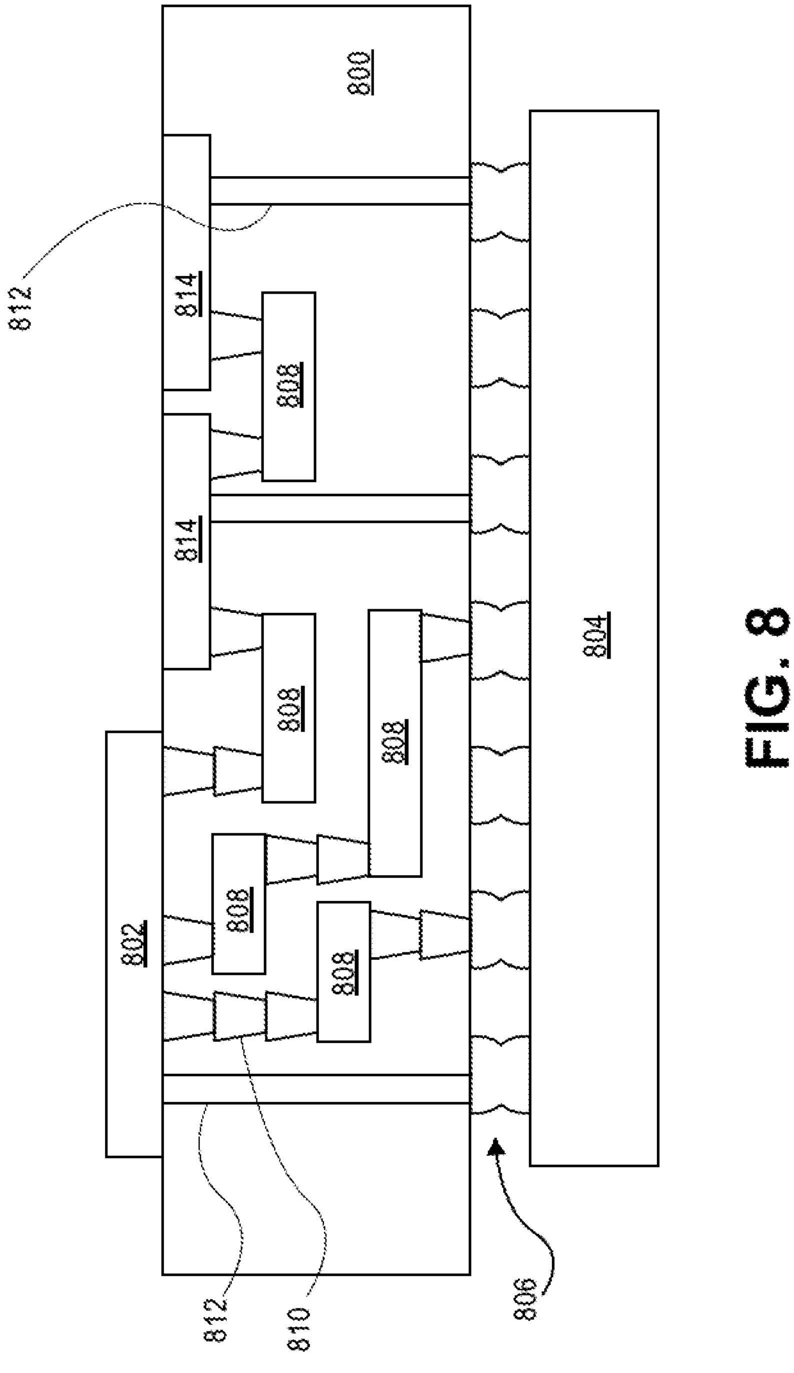
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise an interconnect with a graphene liner that is approximately 6 angstroms thick or less, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise an interconnect with a graphene liner that is approximately 6 angstroms thick or less.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an integrated circuit structure, comprising: a dielectric layer with a first surface and a second surface; an opening through the dielectric layer, wherein the opening is defined by sidewalls; a graphene liner contacting the first surface of the dielectric layer and the sidewalls of the opening; and a conductive material that at least partially fills a remainder of the opening.

Example 2: the integrated circuit structure of Example 1, further comprising: a trace below and in contact with the conductive material.

Example 3: the integrated circuit structure of Example 1 or Example 2, wherein the graphene liner on the sidewalls of the opening does not cover the sidewalls at a bottom region of the opening.

Example 4: the integrated circuit structure of Example 3, wherein the conductive material contacts the sidewalls of the opening at the bottom region of the opening.

Example 5: the integrated circuit structure of Example 3 or Example 4, wherein a height of the bottom region of the opening is approximately 1 nm or less.

Example 6: the integrated circuit structure of Examples 1-5, wherein a width of the opening is approximately 20 nm or less.

Example 7: the integrated circuit structure of Examples 1-6, wherein the conductive material is a via.

Example 8: the integrated circuit structure of Examples 1-7, wherein a thickness of the liner is approximately 6 angstroms or less.

Example 9: an integrated circuit structure, comprising: a first trace, wherein the first trace is lined with a first graphene liner; a second trace, wherein the second trace is lined with a second graphene liner; and a via between the first trace and the second trace, wherein the via is lined with a third graphene liner, and wherein a bottom of the via contacts the second trace.

Example 10: the integrated circuit structure of Example 9, wherein the first graphene liner is along sidewalls and a bottom surface of the first trace, and wherein the second graphene liner is along sidewalls and a bottom surface of the second trace.

Example 11: the integrated circuit structure of Example 9 or Example 10, wherein the third graphene layer stops short of a bottom of the via.

Example 12: the integrated circuit structure of Examples 9-11, wherein the via has a thickness that is approximately 20 nm or less.

Example 13: the integrated circuit structure of Examples 9-12, wherein sidewalls of the via are tapered.

Example 14: the integrated circuit structure of Examples 9-13, wherein the first trace is substantially orthogonal to the second trace.

Example 15: the integrated circuit structure of Examples 9-14, wherein the first graphene liner is contacted by the third graphene liner.

Example 16: the integrated circuit structure of Example 15, wherein the third graphene liner does not contact the second graphene liner.

Example 17: the integrated circuit structure of Examples 9-16, wherein the first graphene liner, the second graphene liner, and the third graphene liner have thicknesses that are approximately 6 angstroms or less.

Example 18: a method of forming an integrated circuit structure, comprising: forming an opening in a dielectric layer, wherein the opening exposes a top surface of a first conductive material; forming a self-assembled monolayer (SAM) over the first conductive material; treating the dielectric layer with a plasma; forming a graphene liner over sidewalls of the opening; removing the SAM; and filling the opening with a second conductive material.

Example 19: the method of Example 18, wherein the graphene liner has a thickness that is approximately 6 angstroms or less.

Example 20: the method of Example 18 or Example 19, wherein a width of the opening is approximately 20 nm or less.

Example 21: the method of Examples 18-20, wherein the SAM has a thickness that is approximately 1 nm or less.

Example 22: the method of Examples 18-21, wherein the plasma treatment is a halogen-based plasma treatment.

Example 23: the method of Examples 18-22, wherein the first conductive material is a trace, and wherein the second conductive material is a via.

Example 24: an electronic system, comprising: a board; a package substrate coupled to the board; and a die coupled to the package substrate, wherein the die comprises an integrated circuit structure, wherein the integrated circuit structure comprises: a first trace, wherein the first trace comprises a first graphene liner that is U-shaped; a second trace, wherein the second trace comprises a second graphene liner that is U-shaped; and a via between the first trace and the second trace, wherein the via comprises a third graphene liner that surrounds a perimeter of the via.

Example 25: the electronic system of Example 24, wherein a bottom of the third graphene liner is above a bottom surface of the via.

What is claimed is:

1. An integrated circuit structure, comprising:
- a dielectric layer with a first surface and a second surface;
- an opening through the dielectric layer, wherein the opening is defined by sidewalls;
- a graphene liner contacting the first surface of the dielectric layer and the sidewalls of the opening, wherein the graphene liner on the sidewalls of the opening does not cover the sidewalls at a bottom region of the opening; and
- a conductive material that at least partially fills a remainder of the opening.

2. The integrated circuit structure of claim 1, further comprising:
- a trace below and in contact with the conductive material.

3. The integrated circuit structure of claim 1, wherein the conductive material contacts the sidewalls of the opening at the bottom region of the opening.

4. The integrated circuit structure of claim 1, wherein a height of the bottom region of the opening is approximately 1 nm or less.

5. The integrated circuit structure of claim 1, wherein a width of the opening is approximately 20 nm or less.

6. The integrated circuit structure of claim 1, wherein the conductive material is a via.

7. The integrated circuit structure of claim 1, wherein a thickness of the liner is approximately 6 angstroms or less.

8. An integrated circuit structure, comprising:
- a first trace, wherein the first trace is lined with a first graphene liner;
- a second trace, wherein the second trace is lined with a second graphene liner; and
- a via between the first trace and the second trace, wherein the via is lined with a third graphene liner, wherein a bottom of the via contacts the second trace, wherein a bottom surface of the third graphene liner is above the bottom of the via.

9. The integrated circuit structure of claim 8, wherein the first graphene liner is along sidewalls and a bottom surface of the first trace, and wherein the second graphene liner is along sidewalls and a bottom surface of the second trace.

10. The integrated circuit structure of claim 8, wherein the via has a thickness that is approximately 20 nm or less.

11. The integrated circuit structure of claim 8, wherein sidewalls of the via are tapered.

12. The integrated circuit structure of claim 8, wherein the first trace is substantially orthogonal to the second trace.

13. The integrated circuit structure of claim 8, wherein the first graphene liner is contacted by the third graphene liner.

14. The integrated circuit structure of claim 13, wherein the third graphene liner does not contact the second graphene liner.

15. The integrated circuit structure of claim 8, wherein the first graphene liner, the second graphene liner, and the third graphene liner have thicknesses that are approximately 6 angstroms or less.

16. A method of forming an integrated circuit structure, comprising:
- forming an opening in a dielectric layer, wherein the opening exposes a top surface of a first conductive material;
- forming a self-assembled monolayer (SAM) over the first conductive material;
- treating the dielectric layer with a plasma;
- forming a graphene liner over sidewalls of the opening, wherein the graphene liner on the sidewalls of the opening does not cover the sidewalls at a bottom region of the opening;
- removing the SAM; and
- filling the opening with a second conductive material.

17. The method of claim 16, wherein the graphene liner has a thickness that is approximately 6 angstroms or less.

18. The method of claim 16, wherein a width of the opening is approximately 20 nm or less.

19. The method of claim 16, wherein the SAM has a thickness that is approximately 1 nm or less.

20. The method of claim 16, wherein the plasma treatment is a halogen-based plasma treatment.

21. The method of claim 16, wherein the first conductive material is a trace, and wherein the second conductive material is a via.

22. An electronic system, comprising:
- a board;
- a package substrate coupled to the board; and
- a die coupled to the package substrate, wherein the die comprises an integrated circuit structure, wherein the integrated circuit structure comprises:
  - a first trace, wherein the first trace comprises a first graphene liner that is U-shaped;
  - a second trace, wherein the second trace comprises a second graphene liner that is U-shaped; and
- a via between the first trace and the second trace, wherein the via comprises a third graphene liner that surrounds a perimeter of the via, wherein a bottom of the third graphene line is above a bottom surface of the via.

* * * * *